(12) United States Patent
Krishnan et al.

(10) Patent No.: US 11,914,411 B2
(45) Date of Patent: Feb. 27, 2024

(54) BANDGAP REFERENCE WITH INPUT AMPLIFIER FOR NOISE REDUCTION

(71) Applicant: Texas Instruments Incorporated, Dallas, TX (US)

(72) Inventors: Sandeep Shylaja Krishnan, Kozhikode (IN); Tallam Vishwanath, Bengaluru (IN); Akshay Yashwant Jadhav, Pune (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 162 days.

(21) Appl. No.: 17/314,637

(22) Filed: May 7, 2021

(65) Prior Publication Data

US 2021/0349490 A1   Nov. 11, 2021

(51) Int. Cl.
*G05F 3/30* (2006.01)
*G05F 3/26* (2006.01)
*H03F 3/45* (2006.01)
*G05F 3/22* (2006.01)

(52) U.S. Cl.
CPC .............. *G05F 3/265* (2013.01); *G05F 3/222* (2013.01); *G05F 3/225* (2013.01); *G05F 3/30* (2013.01); *H03F 3/45179* (2013.01)

(58) Field of Classification Search
CPC ... G05F 3/265; G05F 3/30; G05F 3/20; G05F 3/22; G05F 3/222; G05F 3/225; G05F 3/245; H03F 3/45179; H03F 2200/447; H03F 2200/456; H03F 2203/45564; H03F 3/45475; H03F 3/45928
See application file for complete search history.

(56) References Cited

U.S. PATENT DOCUMENTS

| | | | |
|---|---|---|---|
| 5,168,210 A | 12/1992 | Thus | |
| 5,834,926 A | 11/1998 | Kadanka | |
| 10,353,414 B2 | 7/2019 | Krishnan | |
| 2018/0292849 A1* | 10/2018 | Krishnan | ................. G05F 1/59 |

FOREIGN PATENT DOCUMENTS

| | | |
|---|---|---|
| CN | 203673379 U | 6/2014 |
| CN | 107656569 A | 2/2018 |
| CN | 207337259 U | 5/2018 |

OTHER PUBLICATIONS

PCT International Search Report dated Jul. 22, 2021.

* cited by examiner

*Primary Examiner* — Jung Kim
(74) *Attorney, Agent, or Firm* — Charles F. Koch; Frank D. Cimino

(57) ABSTRACT

A bandgap reference circuit includes first through fourth bipolar junction transistors (BJTs). The base and collector of the first BJT are shorted together. The second BJT is coupled to the first BJT via a first resistor. The base of the third BJT is coupled to the base of the first BJT. The base and collector of the fourth BJT are coupled together and also are coupled to the base of the second BJT. A second resistor is coupled to the fourth emitter of the fourth BJT. A third resistor is coupled to the second resistor and to the emitter of the second BJT. An operational amplifier has a first input coupled to the first resistor and the collector of the second BJT, a second input coupled to the emitter of the third BJT and the collector of the fourth BJT, and an output coupled to the collectors of the first and third BJTs.

4 Claims, 3 Drawing Sheets

BANDGAP REFERENCE WITH INPUT AMPLIFIER FOR NOISE REDUCTION

CROSS-REFERENCE TO RELATED APPLICATIONS

This application claims priority to India Provisional Application No. 20204109448, filed May 7, 2020, which is hereby incorporated by reference.

BACKGROUND

Bandgap reference voltage supplies are used in various electronic applications. These voltage supplies provide constant reference voltages despite power supply variations, load variations, and temperature changes.

SUMMARY

In one example, a bandgap reference circuit includes first through fourth bipolar junction transistors (BJTs). The base and collector of the first BJT are shorted together. The second BJT is coupled to the first BJT via a first resistor. The base of the third BJT is coupled to the collector of the first BJT. The base and collector of the fourth BJT are coupled together. A second resistor is coupled to the fourth emitter of the fourth BJT. A third resistor is coupled to the second resistor and to the emitter of the second BJT. An operational amplifier has a first input coupled to the first resistor and the collector of the second BJT, a second input coupled to the emitter of the third BJT and the collector of the fourth BJT, and an output coupled to the collectors of the first and third BJTs.

BRIEF DESCRIPTION OF THE DRAWINGS

The same reference number is used in the drawings for the same or similar (either by function and/or structure) features.

DETAILED DESCRIPTION

As mentioned above, bandgap reference voltage supplies provide constant, high-precision reference voltages in the face of various fluctuating parameters, including ambient temperature. Many bandgap reference voltage supplies operate on the principle of offsetting the negative temperature coefficient of one circuit with a positive temperature coefficient of another circuit. Bandgap reference voltage supplies include a complementary to absolute temperature (CTAT) voltage source coupled in series to a proportional to absolute temperature (PTAT) voltage source. For a CTAT voltage source, the voltage is inversely related to temperature (the voltage decreases as temperature increases, and the voltage increases as the temperature decreases), while for a PTAT voltage source, the voltage is directly related to temperature (as temperature increases, the voltage also increases, and vice versa). Because the CTAT voltage source's voltage changes in the opposite direction as the PTAT voltage source with changes in temperature, the resulting output voltage of the bandgap reference supply remains approximately unchanged.

Such bandgap reference voltage supplies suffer from multiple sources of flicker noise. Some of the flicker noise arises from transistors (e.g., bipolar junction transistors, BJTs) in the voltage supplies, but this type of flicker noise is typically addressed by adding a resistor between the base and collector of each BJT. Most of the remainder of the flicker noise arises from the base currents of the input transistor pair of the operational amplifier included within the bandgap reference voltage supply. The operational amplifier's input transistor pair generates flicker noise that is typically low frequency (e.g., 0.1 Hz to 10 Hz). Such low-frequency noise can be difficult to eliminate because one technique for eliminating the low frequency noise is to use large filter capacitors, which may not be practical in low-power applications. Additional resources (e.g., power) can be expended to reduce the noise, but this also may be impractical in low-power applications. Accordingly, what is needed is a bandgap reference voltage supply capable of reducing flicker noise at low frequencies without excessive power consumption.

Described herein are examples of a bandgap reference circuit that includes a bandgap network coupled to an operational amplifier. At least one of the transistors within the bandgap network is configured to function also as part of a gain stage. In one example, the transistor is a BJT configured as a common-emitter amplifier. By including a gain stage within the bandgap network, flicker noise generated within the operational amplifier is attenuated.

Figure 1:
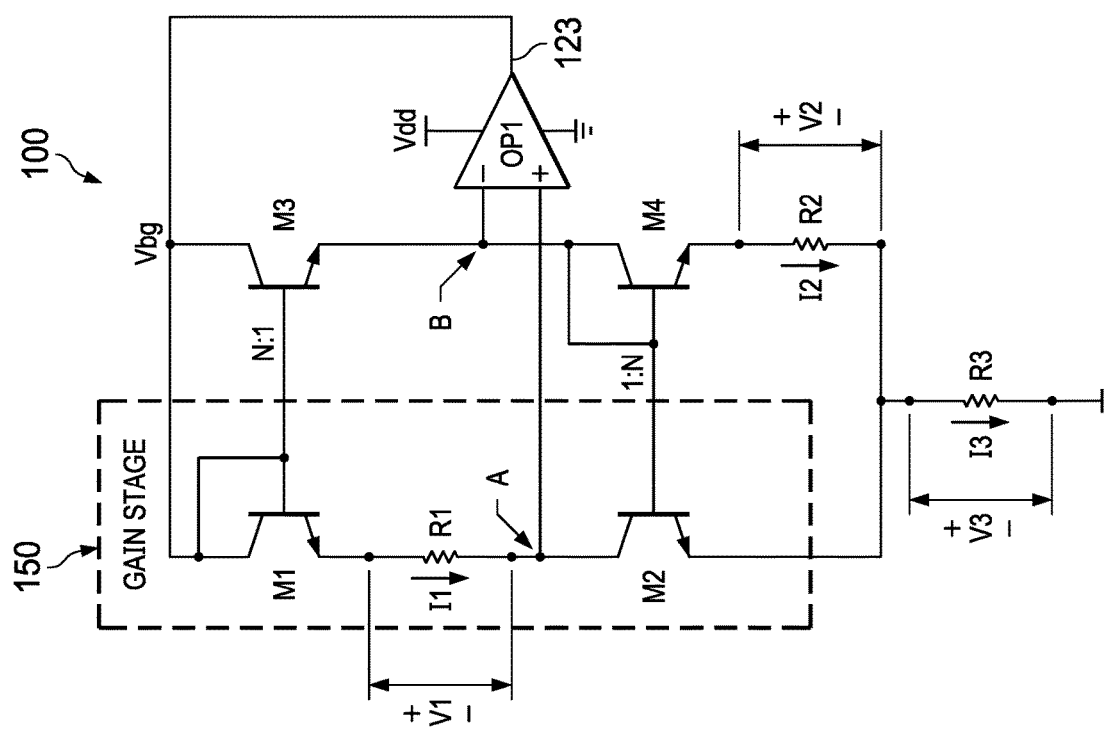
FIG. 1 is a circuit schematic depicting an illustrative bandgap reference circuit in accordance with various examples.

FIG. 1 is a circuit schematic diagram of an illustrative bandgap reference circuit 100. The bandgap reference circuit in FIG. 1 includes transistors M1, M2, M3, and M4, resistors R1, R2, and R3, and an operation amplifier OP1. The combination of transistors M1 and M2 and resistor R1 functions as the gain stage 150, mentioned above. In this illustrative example, transistors M1-M4 are NPN BJTs. The operational amplifier OP1 has a non-inverting (positive) input, an inverting (negative) input, and an output 123. The output 123 of operational amplifier OP1 provides the output bandgap voltage (VBG) from the bandgap reference circuit 100.

The output 123 of operational amplifier OP1 is coupled to the collectors of transistors M1 and M3. The bases of transistors M1 and M3 are coupled together and to their collectors. Resistor R1 is coupled between the emitter of transistor M1 and the collector of transistor M2. The connection between resistor R1 and the collector of transistor M2 is labeled node A. The non-inverting input of operational amplifier OP1 is coupled to node A, and thus to resistor R3 and to the collector of transistor M2.

The bases of transistors M2 and M4 are coupled together and to the collector of transistor M4. The emitter of transistor M3 is coupled to the collector of transistor M4 at node B. The inverting input of operational amplifier OP1 is coupled to node B, and thus to the emitter of transistor M3 and to the collector of transistor M4. Resistor R2 is coupled to the emitter of transistor M4. Resistor R3 is coupled between ground and the resistor R2, and between ground and the emitter of transistor M2.

Transistor M1 is larger than transistor M3 as indicated by the sizing ratio "N:1" where N is an integer greater than 1. Transistor M1 being N times as large as transistor M3 means that transistor M1 comprises N transistor fingers whereas transistor M3 has one transistor. In one example, N is 8. In another example N is 24. Transistor M2 is smaller than transistor M4 as indicated by the sizing ratio "1:N." Accordingly, transistor M1 is N times larger than transistor M3, and similarly, transistor M4 is N times larger than transistor M2.

With the circuit at steady state (producing an approximately constant bandgap voltage VBG), the voltage difference between the inverting and non-inverting inputs of the operational amplifier OP1, and with the input pair of transistors being identically sized (1:1 ratio), is approximately 0 V. Accordingly, the voltage on node A approximately equals the voltage on node B. Applying Kirchoff's Voltage Law (KVL) around the loop including node A, operational amplifier OP1, transistors M3 and M1, and resistor R1, the voltage across resistor R1 (V1) is the difference in the base-to-emitter voltages (Vbe) between transistors M3 and M1. Designating the Vbe of transistor M3 to be Vbe_M3 and the Vbe of transistor M1 to be Vbe_M1, the difference (ΔVbe) in Vbe's between those two transistors is ΔVbe=Vbe_M3−Vbe_M1, where Vbe_M3 is the Vbe for transistor M3 and Vbe_M1 is the Vbe for transistor M1. Although the Vbe of an individual BJT is a CTAT voltage, the difference in Vbe's between transistors M3 and M1 is a PTAT voltage. That ΔVbe is a PTAT voltage stems from the fact that the ΔVbe between transistors M3 and M1 is: $\Delta Vbe = V_T * \ln(N)$, wherein N is the sizing ratio between transistors M1 and M3, $V_T$ is the thermal voltage of a BJT, and "ln" is the natural logarithm function. The thermal voltage $V_T$ is equal to kT/q, where T is temperature (in units of Kelvin), q is the charge on an electron, and k is Boltzman's constant. Because $V_T$ is a function of temperate T, the thermal voltage ($V_T$) is a PTAT voltage and thus the ΔVbe between transistors M3 and M1 also is a PTAT voltage. The ΔVbe between transistors M3 and M1 is the voltage V1 across resistor R1, which means that the voltage across resistor R1 is a PTAT voltage. The current through resistor R1 is shown in FIG. 1 as I1 and is ΔVbe/R1. Because the voltage V1 is a PTAT voltage, the current I1 is a PTAT current.

Applying a similar analysis to the loop including transistors M2 and M4, resistor R2, and the operational amplifier OP1, the voltage across resistor R2 (shown as V2) is the ΔVbe between transistors M2 and M4. For much the same reason as explained above for voltage V1, voltage V2 also is a PTAT voltage. Because the voltage V2 also is a PTAT voltage, the current through resistor R2 (shown as I2) is a PTAT current.

The current through resistor R3 is shown as I3 and is the sum of currents I1 and I2. Because currents I1 and I2 are PTAT currents, current I3 also is a PTAT current. Accordingly, the voltage V3 across resistor R3 is a PTAT voltage, while the Vbe of each of the transistors M1-M4 are CTAT voltages.

Starting from the ground terminal and progressing up the circuit to the voltage VBG, bandgap reference circuit 100 includes a PTAT voltage V3 in series with a CTAT Vbe voltage for transistor M2, an approximately zero voltage drop between the non-inverting and inverting inputs of the operational amplifier OP1, and a CTAT Vbe voltage for transistor M3. Similarly, the circuit includes a series combination of the PTAT voltage V3 and CTAT Vbe voltages for transistors M4 and M1.

Referring still to FIG. 1, the base of transistor M4 being coupled to the collector of transistor M4 configures transistor M4 as a diode. The base and collector of transistor M4 are coupled to node B and to the inverting input of amplifier OP1. However, the base of transistor M2 is not coupled to the collector of transistor M2, and instead is coupled to the base and collector of transistor M4 and thus also to the inverting input of operational amplifier OP1. In this configuration, transistor M2 also functions as a common-emitter amplifier, the input of which is the base of transistor M2 and the output is its collector (node A). The combination of transistor M1, resistor R1, and transistor M2 is operative as a gain stage 150 as represented by the dashed box. The transconductance of transistor M1 is represented as gm_M1 and the transconductance of transistor M2 is represented as gm_M2. The gain of the gain stage 150 is gm_M2*R, where R=R1+1/(gm_M1). The configuration of the bandgap circuit 100 to include the gain stage 150 advantageously results in flicker noise generated within the operation amplifier OP1 being attenuated by the factor gm_M2*R.

Figure 2:
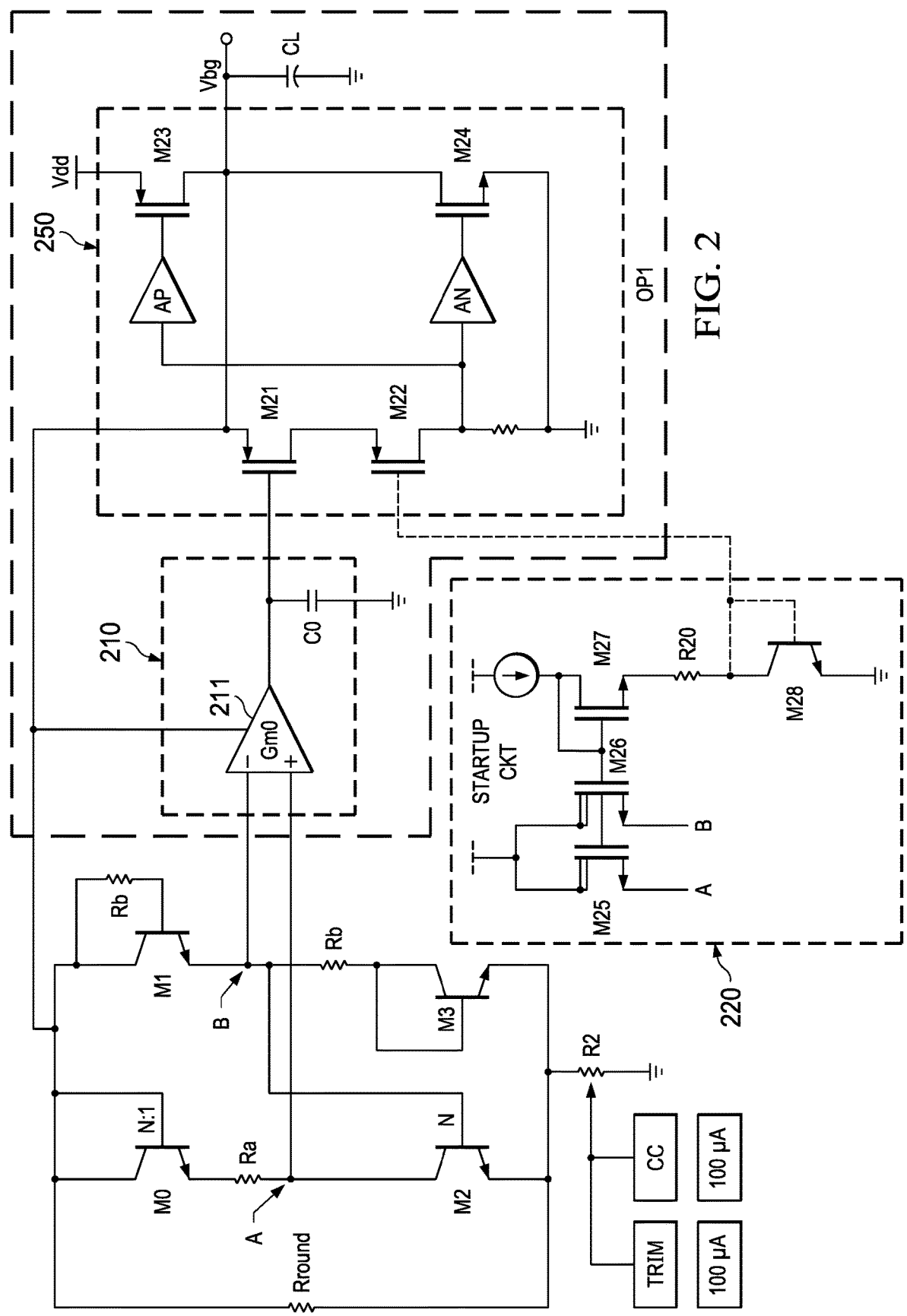
FIG. 2 is a circuit of an operational amplifier included in the bandgap reference circuit of FIG. 1.

FIG. 2 shows a circuit schematic including additional detail of operational amplifier OP1. As shown in the example of FIG. 2, operational amplifier OP1 includes a first stage 210 coupled to a second stage 250. The first stage 210 includes a transconductance circuit 211 (having a transconductance value of GM0) coupled to a capacitor C0.

The second stage 250 includes transistors M21-M24 and gain elements AP and AN coupled together to form a super source-follower buffer. In this example, transistors M21-M23 are P-type metal oxide semiconductor field effect transistors (PMOS transistors) and transistor M24 is an N-type metal oxide semiconductor field effect transistor (NMOS transistor). The output voltage VBG is the voltage on the source of transistor M21. The second gain stage 250 is configured for unity gain albeit with an offset voltage due to the gate-to-source voltage (Vgs) of transistor M21.

FIG. 2 also shows an example of a start-up circuit 220 that includes transistors M25-M28 and a resistor R20. The start-up circuit 220 sets the gate voltage of transistor M22 to one threshold voltage (Vt) of the transistor below a chosen threshold voltage value, for example, Vthresh. During start-up of the bandgap reference circuit, when VBG is smaller than Vthresh, transistor M22 will be OFF. This results in transistor M23 of the second stage 250 to slew and rapidly charge up the load capacitor $C_L$ as well as the bandgap core. Once the voltage VBG becomes larger than Vthresh, M22 turns ON and the second stage 250 shifts from slew mode to source-follower mode, in which the bandgap loop starts regulating VBG and brings it to its final steady state value. The voltage Vthresh is chosen such that the final VBG-Vthresh is slightly greater than the drain-to-source saturation voltage ($V_{DS,SAT}$) of transistor M21 so as to keep transistor M21 operating in the saturation region. Setting the gate voltage of transistor M22 to Vthresh-Vt is achieved by passing a pre-generated ΔVbe/R (where R is the sum of the resistance of resistor R20 and any other resistors along the current path through M28 to ground) current through a series of diode-connected BJTs (e.g., transistor M28) and resistors and tapping from a node between them (see dashed line from the collector of transistor M28 to the gate of transistor M22. In addition to setting the gate voltage on transistor M22, the start-up circuit 220 also injects current and tries to pull-up nodes A and B (sources of transistors M25 and M26) with the help of M25 and M26. The start-up circuit 220 is configured such that transistors M25 and M26 turn off when the voltage on nodes A and B become close to their steady state value.

Figure 3:
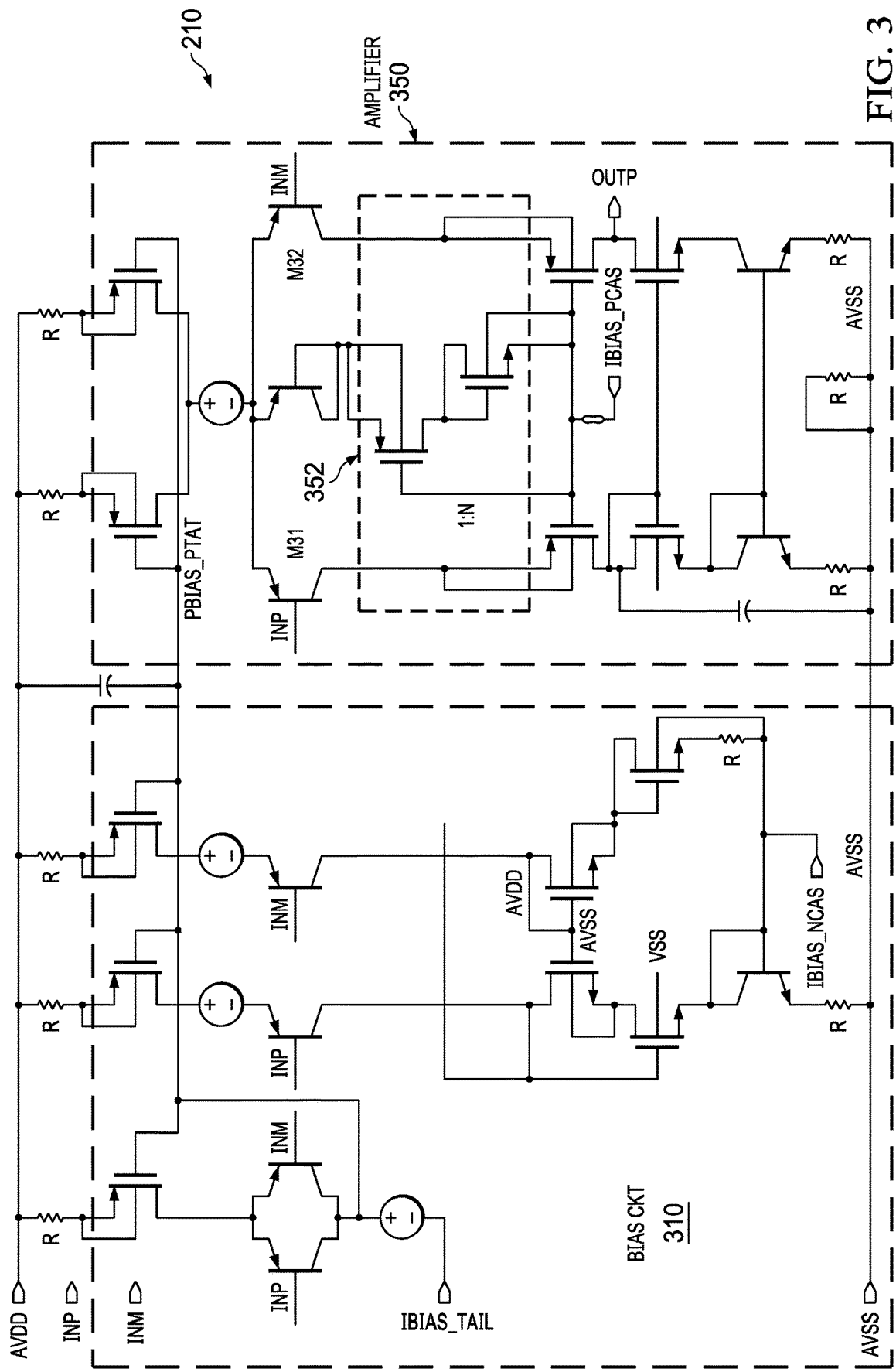
FIG. 3 is a circuit schematic of an implementation of a stage of the operational amplifier.

The first stage 210 may be configured to have a relatively high gain. FIG. 3 shows an example implementation of the first stage 210. The first stage 210 includes a bias circuit 310 coupled to an amplifier 350. The bias circuit 310 generates various bias voltages such as PBIAS_PTAT for use in the amplifier 350. The amplifier 350 includes an input transistor pair 352 which includes transistors M31 and M32. In this example, transistors M31 and M32 are PNP transistors. The base of transistor M31 is the non-inverting input which is coupled to node A in FIG. 1. The base of transistor M32 is the inverting input which is coupled to node B in FIG. 1. In this example, the sizing ratio between transistors M31 and M32 is the same as for the transistor pairs of FIG. 1, that is, 1:N. The Vbe voltage of each of transistors M31 and M32 is different due to the different sizes of the transistors. The voltage difference between the base of transistor M31 and the base of transistor M32 (i.e., between the non-inverting and inverting inputs of the operational amplifier OP1) is the difference between the Vbe voltages of transistors M31 and M32. In the example described above in which the inverting and non-inverting inputs have the same voltage, the sizing ratio between the corresponding pair of input transistors was 1:1, but in the example of FIG. 3 the sizing ratio is 1:N.

Referring again to FIG. 1, with the voltage difference between the inverting and non-inverting inputs of operational amplifier OP1 being equal to the difference in the Vbe of transistors M31 and M32 (as opposed to an approximately zero voltage difference as explained above), the voltage V1 across resistor R1 is ΔVbe_OP1−Vbe_M3−Vbe_M1, where ΔVbe_OP10 is the difference in Vbe voltages between transistors M31 and M32. The Vbe difference between transistors M31 and M32 adds an extra value of ΔVbe into the voltage V1 across resistor R1. Because the voltage V1 is greater due to the additional ΔVbe from the operational amplifier's first stage 210 (compared to what voltage V1 would have been if the input pair M31 and M32 were identically sized), the current I1 in FIG. 1 increases, and consequently the summed current I3 also increases. To maintain the same PTAT voltage V3 across resistor R3 for the increased current I3, the resistance value of resistor R3 is decreased (e.g., by a factor of 2).

A gain of $$\left(1 + \frac{R3}{R1}\right)$$

is applied to the noise generated within the operational amplifier OP1. An advantage of configuring the operational amplifier OP1 to present an extra ΔVbe voltage across resistors R1 and R2 (by fabricating transistor M32 to be N times as large as transistor M31) is that the resistance R3 can and should be decreased to maintain the same PTAT V3 voltage and the same level of VBG. Advantageously, with resistance R3 being decreased, the noise of the operational amplifier OP1 is further attenuated.

Figure 4:
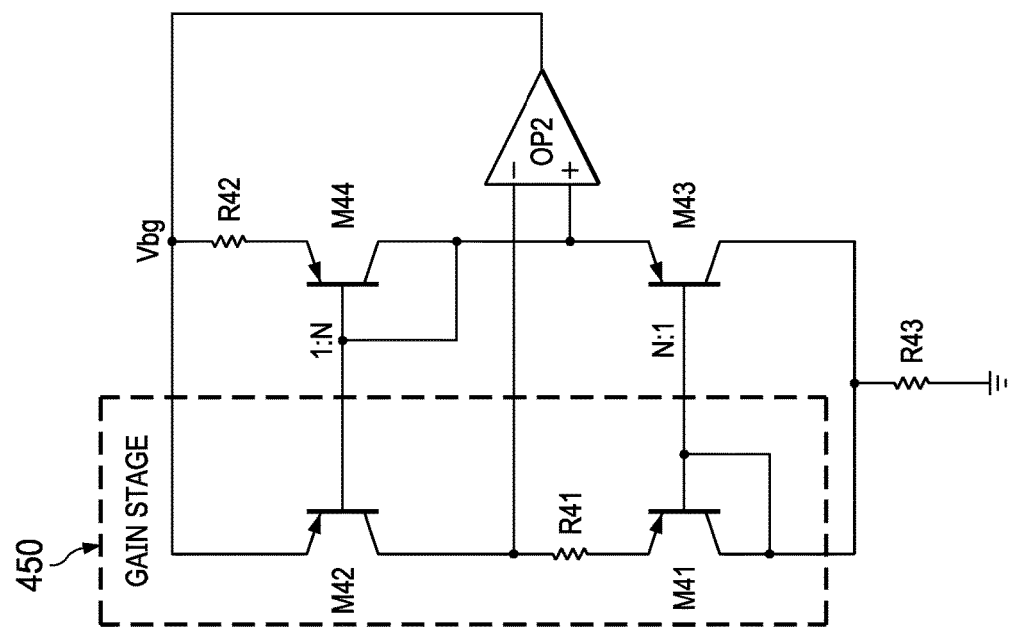
FIG. 4 is a circuit schematic depicting an alternative embodiment of a bandgap reference circuit.

FIG. 4 is a circuit schematic depicting an alternative embodiment to that shown in FIG. 1. FIG. 4 is a schematic of a bandgap reference circuit 400 that includes transistors M41, M42, M43, and M44, resistors R41, R42, and R43, and an operational amplifier OP2. The transistors M41-M44 in bandgap reference circuit 400 are PNP BJTs. The operation of the bandgap reference circuit 400 largely is the same as that of bandgap reference circuit 100 in FIG. 1. Transistors M41 and M42 and resistor R41 form a gain stage 450, which is operative to attenuate flicker noise generated internal to operational amplifier OP2 in much the same way as the gain stage 150 of FIG. 1. Transistor M42 in FIG. 4 also functions as an amplifier in much the same way that transistor M2 of FIG. 1 was operative as an amplifier.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described examples, and other examples are possible within the scope of the claims.

Modifications are possible in the described embodiments, and other embodiments are possible, within the scope of the claims.

What is claimed is:

1. A bandgap reference circuit, comprising:
    a first bipolar junction transistor (BJT) having a first emitter, a first base, and a first collector, the first base shorted to the first collector;
    a second BJT coupled to the first BJT via a first resistor, the second BJT having a second emitter, a second base, and a second collector;
    a third BJT coupled to the first BJT, the third BJT having a third emitter, a third base, and a third collector, the third base coupled to the first base;
    a fourth BJT coupled to the third BJT, the fourth BJT having a fourth emitter, a fourth base, and a fourth collector, the fourth base shorted to the fourth collector, and the fourth base coupled to the second base;
    a second resistor coupled to the fourth emitter;
    a third resistor coupled to the second resistor and to the second emitter; and
    an operational amplifier having a first input coupled to the first resistor and the second collector, a second input coupled to the third emitter and the fourth collector, and an output coupled to the first and third collectors.

2. The bandgap reference circuit of claim 1, wherein:
    the operational amplifier includes a first stage coupled to a second stage, the first stage including a transistor pair having a first sizing ratio; and
    the first and third transistors have a second sizing ratio that is approximately the same as the first sizing ratio.

3. The bandgap reference circuit of claim 1, wherein the operational amplifier includes a first stage coupled to a second stage, the first stage including an input pair of transistors having a 1:1 sizing ratio.

4. The bandgap reference circuit of claim 1, wherein the first, second, third, and fourth BJTs are NPN BJTs.

* * * * *